United States Patent
Yang

[11] Patent Number: 6,051,482
[45] Date of Patent: Apr. 18, 2000

[54] METHOD FOR MANUFACTURING BURIED-CHANNEL PMOS

[75] Inventor: Jiuun-Jer Yang, Taipei, Taiwan

[73] Assignee: Winbond Electronics Corp., Hsinchu, Taiwan

[21] Appl. No.: 09/024,347

[22] Filed: Feb. 17, 1998

[30] Foreign Application Priority Data

Nov. 20, 1997 [TW] Taiwan ................................. 86117337

[51] Int. Cl.$^7$ ................................................. H01L 21/22
[52] U.S. Cl. .......................... 438/526; 438/217; 438/282; 438/289
[58] Field of Search .................................. 438/526, 305, 438/282, 174, 194, 217, 207, 208, 289; 257/404, 408

[56] References Cited

U.S. PATENT DOCUMENTS

| | | | |
|---|---|---|---|
| 4,912,065 | 3/1990 | Mizuno et al. | 438/513 |
| 4,927,777 | 5/1990 | Hsu et al. | 438/223 |
| 5,266,510 | 11/1993 | Lee | 438/526 |
| 5,401,994 | 3/1995 | Adan | 257/404 |
| 5,476,800 | 12/1995 | Burton et al. | 438/526 |
| 5,489,543 | 2/1996 | Hong | 438/291 |
| 5,538,913 | 7/1996 | Hong | 438/282 |
| 5,597,752 | 1/1997 | Niwa | 438/291 |
| 5,625,217 | 4/1997 | Chau et al. | 257/408 |
| 5,668,021 | 9/1997 | Subramanian et al. | 438/526 |
| 5,681,771 | 10/1997 | Hwang | 438/217 |
| 5,710,055 | 1/1998 | Kizilyalli | 438/289 |
| 5,796,145 | 8/1998 | Sato | 257/408 |
| 5,866,460 | 2/1999 | Akram et al. | 438/289 |

OTHER PUBLICATIONS

Felch et al, "Formation of Deep Sub–Micron Buried Channel pMOSFETs with Plasma Doping," IEEE, pp. 753–756, Oct. 1997.

*Primary Examiner*—Donald L. Monin, Jr.
*Assistant Examiner*—Michael Dietrich
*Attorney, Agent, or Firm*—Merchant & Gould P.C.

[57] ABSTRACT

A method for manufacturing a buried-channel pMOSFET device that utilizes a plasma doping technique to form a very shallow P-type channel layer on the top surface of a submicron buried-channel pMOSFET. The buried-channel pMOSFET device formed by the method has a higher current drivability and a higher anti-punchthrough resistance.

49 Claims, 6 Drawing Sheets

METHOD FOR MANUFACTURING BURIED-CHANNEL PMOS

CROSS-REFERENCE TO RELATED APPLICATION

This application claims the priority benefit of Taiwan application Ser. No. 86117337, filed Nov. 20, 1997, the fall disclosure of which is incorporated herein by reference.

BACKGROUND OF THE INVENTION

1. Field of Invention

The present invention relates to a method for manufacturing P-type metal oxide semiconductor (PMOS). More particularly, the present invention relates to a method for manufacturing a buried-channel PMOS.

2. Description of Related Art

Ever since a large number of complementary MOS (CMOS) transistors are used in very large scale integrated (VLSI) circuits, the fabrication of PMOS transistors are of growing importance in the semiconductor industry. An important factor in the design of PMOS transistors that may affect device performance is the manner in which the doping of polysilicon gate is carried out.

In the fabrication of CMOS transistor that centered upon the production of an N-type polysilicon gate, both the N-type MOS field effect transistor (nMOSFET) and the P-type MOS field effect transistor (pMOSFET) need to perform a P-channel implant. The P-channel implant is necessary for adjusting the channel so that a lower threshold voltage for the VLSI circuit can be obtained. Through the implant process, a buried-channel is formed in the pMOSFET device.

On the other hand, a dual gate type of CMOS transistor can be produced. Due to the N-type channel profile in the pMOSFET and the work function difference between the P-type (P$^+$) polysilicon gate and the doped channel, the pMOSFET device has a surface channel.

Short-channel effect can easily occur in the aforementioned buried-channel pMOSFET device. For example, in an article published in IEEE Trans. Electron Devices, vol. ED-32, pp. 584–589, 1985 by Genda J. Hu et al with the title "Design tradeoff between surface and buried-channel FET's", the author has suggested that the buried-channel device has a lower threshold voltage and a worse turnoff characteristics than a surface-channel device. However, using N-doped (N$^+$) polysilicon gate in the fabrication of both nMOSFET and pMOSFET is capable of saving up to two masking steps. In addition, a buried-channel device has a higher transconductance and higher drain current drivability than a surface-channel device. Hence, buried-channel pMOSFET is now gradually used in short-channel devices. Therefore, how to overcome short-channel effect in the design of deep-submicron buried-channel pMOSFET has become a major topic of research.

FIG. 1A is a cross-sectional view showing a buried-channel pMOSFET device 100, and FIG. 1B is a cross-sectional view showing a surface-channel pMOSFET device 150. As shown in FIGS. 1A and 1B, the buried-channel pMOSFET 100 has an N-doped polysilicon gate 100a while the surface-channel pMOSFET 150 has a P-doped (P$^+$) polysilicon gate 150a. Moreover, in FIG. 1A, the buried-channel pMOSFET 100 has a P-type layer 100b implanted as a P-channel whose junction depth is $X_j$.

FIG. 2 is a graph having two curves in it, one showing the relationship between dopant concentration versus depth from substrate surface for a buried-channel pMOSFET 100 as shown in FIG. 1A and the other showing the same relationship for a surface-channel pMOSFET 150 as shown in FIG. 1B, both under the same threshold voltage of –0.6V. As shown in FIG. 2, curve 200a shows the concentration profile of channel dopants (P-type dopants) in a buried-channel pMOSFET 100 while curve 200b shows the concentration profile of channel dopants (N-type dopants) in a surface-channel pMOSFET 150. Furthermore, curve 200a has an inflection point A at a depth of $X_j$.

FIG. 3 is a graph having two curves, one showing the relationship between voltage potential versus vertical depth from substrate surface for a buried-channel pMOSFET 100 as shown in FIG. 1A and the other showing the same relationship for a surface-channel pMOSFET 150 as shown in FIG. 1B, both under the same gate to source voltage ($V_{GS}$) of 0V and drain to source voltage ($V_{DS}$) of –5V. As shown in FIG. 3, curve 300a is the distribution of electric potential for a buried-channel pMOSFET 100 while curve 300b is the distribution of electric potential for a surface-channel pMOSFET 150. Since there is a P-type layer 100b on the surface of a buried-channel pMOSFET 100, the potential well 310a of curve 300a remains buried inside the substrate unlike the potential well 310b of curve 300b, which is on the substrate surface. Therefore, conduction channel of a buried-channel device is formed inside the substrate, and consequently more vulnerable to short-channel effect than a surface-channel device.

From the above description, if short-channel effect of a submicron buried-channel device is to be reduced, the conduction channel is preferably as close to the substrate surface as possible. The best method to achieve a near-surface conduction channel is to form a very thin P-type layer just beneath the substrate surface. Therefore, a number of articles concerning how to form a shallow P-type layer are published. Examples include an article published by T. Yoshitomi et al in Proceedings of 1993 VLSI Symp. on VLSI Tech., pp. 90–99 with the title of "Ultra-shallow buried-channel pMOSFET with extremely high transconductance", another article published by H. Matsuhashi et al in Proceedings of 1996 VLSI Symp. on VLSI Tech., pp. 36–37 with the title of "High-performance double-layer epitaxial-channel PMOSFET compatible with a single gate CMOSFET", and yet another article published by B. Lee et al in U.S. Pat. No. 5,266,510 having the title of "High performance sub-micron p-channel transistor with germanium implant".

In general, the techniques and method mentioned in the above published articles and patent require complicated processing and stringent controlling factors. Only the low-energy boron implantation technique suggested by T. Yoshitomi et al in his article is somewhat mature and can be carried out in the present-day CMOS fabrication environment. However, a low-energy boron implant has a rather low throughput and is therefore not quite cost effective.

In light of the foregoing, there is a need an improved method for forming a buried-channel pMOSFET device.

SUMMARY OF THE INVENTION

Accordingly, the present invention is to provide a method for forming a buried-channel pMOSFET device that uses a newly developed plasma doping technique to form a P-type layer on the upper surface of the substrate of a buried-channel pMOSFET device. The method is a low energy operation and can be carried out at room temperature, but it also has a high throughput.

To achieve these and other advantages and in accordance with the purpose of the invention, as embodied and broadly described herein, the invention provides a method for forming a buried-channel pMOSFET device. The method comprises the steps of providing a first type silicon substrate, wherein field oxide layer for isolating the active region is already formed thereon. Then, a sacrificial oxide layer is formed over the substrate. Next, a plasma doping method is used to form a very shallow P-type layer on the surface of the substrate, and then the sacrificial layer is removed. Subsequently, a gate oxide layer and a polysilicon layer are sequentially formed over the substrate. Thereafter, photolithographic and etching techniques are used to form a polysilicon gate layer. Finally, source/drain regions are formed in the substrate. The steps of forming the sacrificial layer over the substrate and the subsequent removal of the sacrificial layer can be eliminated if desired. Furthermore, if the first type silicon substrate is a P-type substrate, the step of implanting ions in to the substrate to form an N-well should be included after the step of forming the sacrificial layer but before the step of plasma doping.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
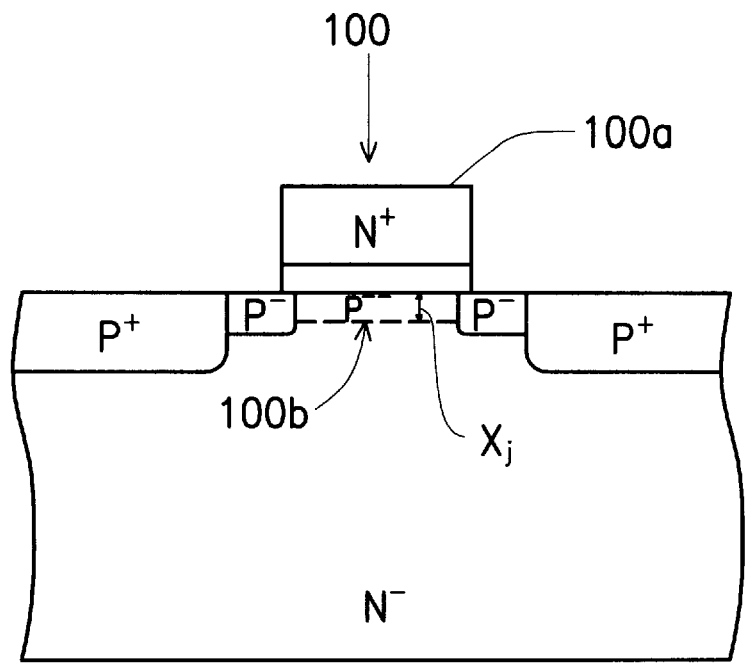
FIG. 1A is a cross-sectional view showing a buried-channel pMOSFET device 100.
Figure 1B:
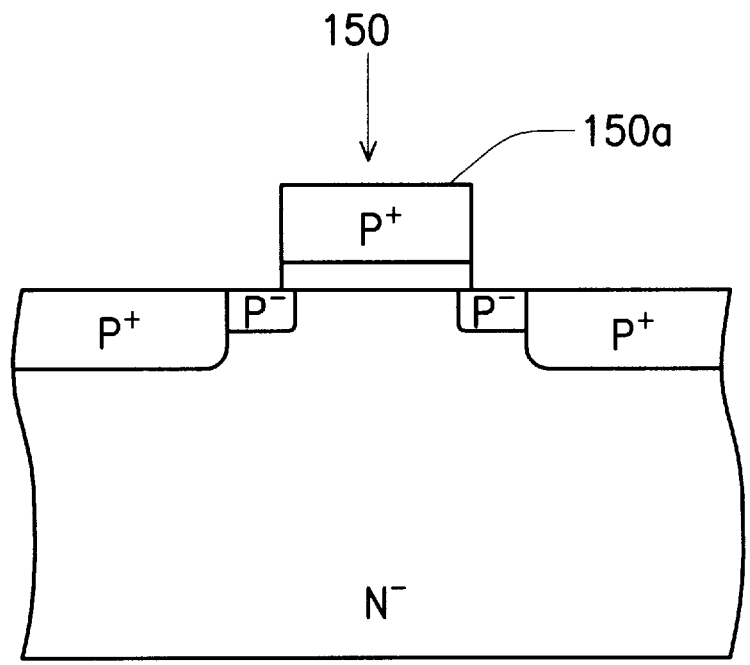
FIG. 1B is a cross-sectional view showing a surface-channel pMOSFET device 150.
Figure 2:
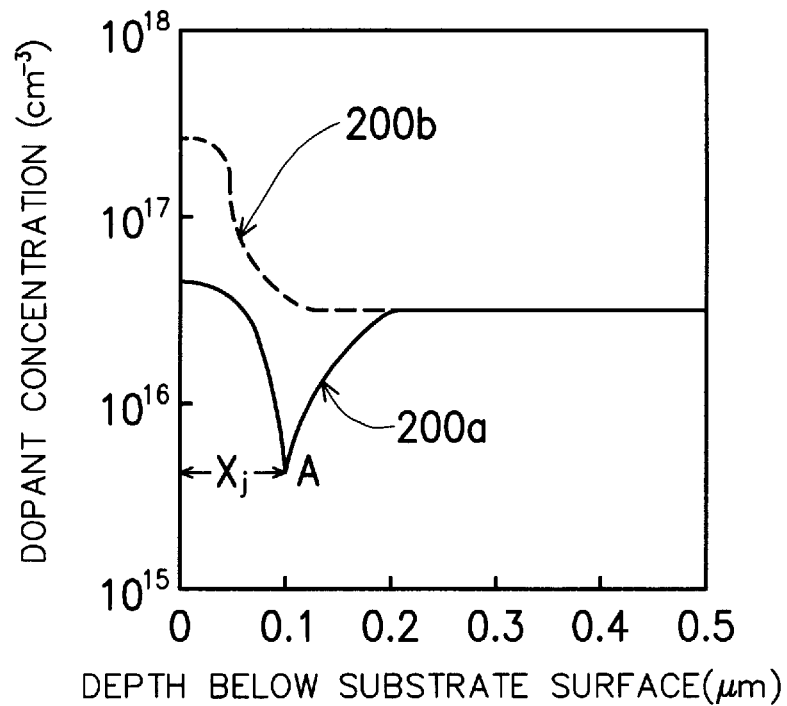
FIG. 2 is a graph having two curves showing the relationship between dopant concentration versus depth from substrate surface for a buried-channel pMOSFET and for a surface-channel pMOSFET respectively.
Figure 3:
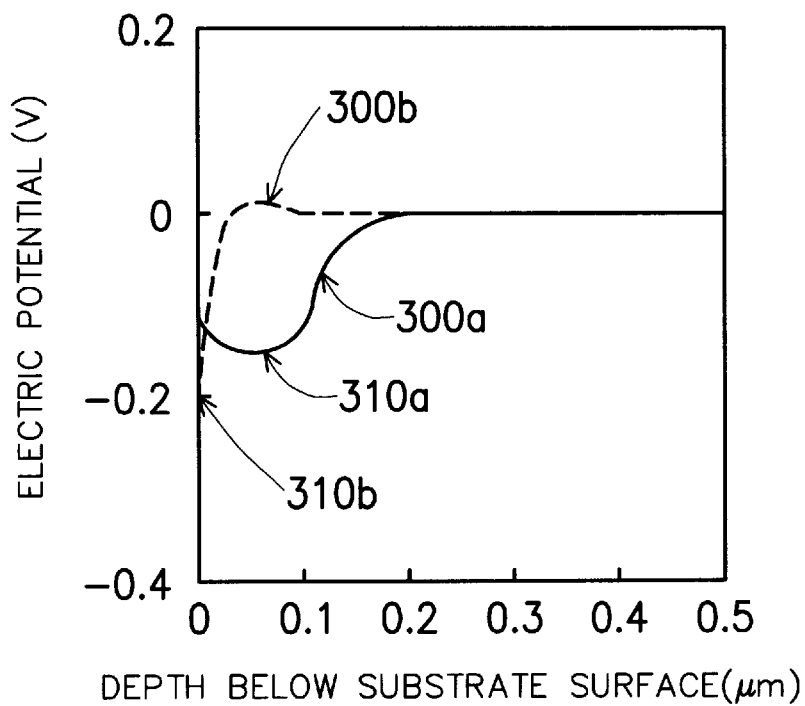
FIG. 3 is a graph having two curves showing the relationship between voltage potential versus vertical depth from substrate surface for a buried-channel pMOSFET and for a surface-channel pMOSFET.

Reference will now be made in detail to the present preferred embodiments of the invention, examples of which are illustrated in the accompanying drawings. Wherever possible, the same reference numbers are used in the drawings and the description to refer to the same or like parts.

Plasma doping is considered one of the most practical methods for obtaining a very shallow doping profile, because plasma doping is a low-energy process that can operate at room temperature and has a rather high throughput. For example, in an article published in Proceedings of 1996 VLSI Symp. on VLSI Tech., pp. 66–67 with the title of "Plasma doping of boron for fabricating the surface channel sub-quarter micron PMOSFET", B. Mizuno et al has suggested using a plasma doping method to form a surface-channel pMOSFET device. In this invention, a plasma doping technique is also used to form a very shallow P-type layer on the substrate surface of a sub-micron buried-channel pMOSFET device. In fact, the plasma doping technique used in this invention is similar to the "Plasma doping method" as described by B. Mizuno et al in U.S. Pat. No. 4,912,065.

Figure 4A:
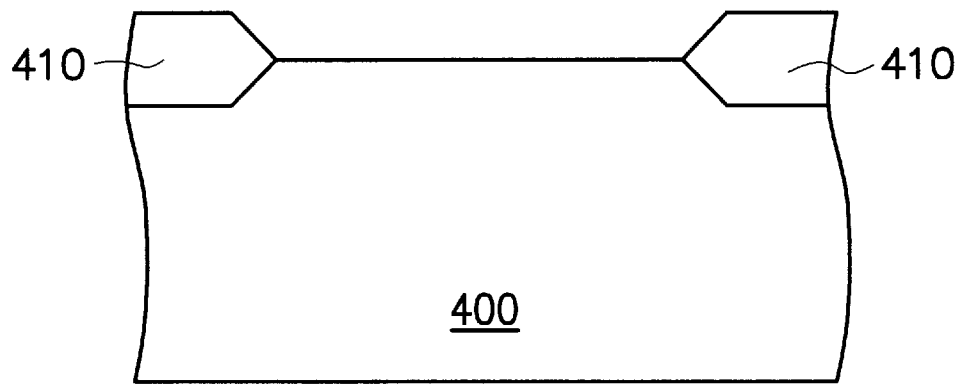
FIGS. 4A through 4H are cross-sectional views showing the progression of manufacturing steps in forming a buried-channel pMOSFET device according to one preferred embodiment of this invention.

FIGS. 4A through 4H are cross-sectional views showing the progression of manufacturing steps in forming a buried-channel pMOSFET device according to one preferred embodiment of this invention. First, as shown in FIG. 4A, a P-type (or N-type) semiconductor substrate 400 having field oxide layers 410 already formed thereon for defining the active region is provided.

Figure 4B:
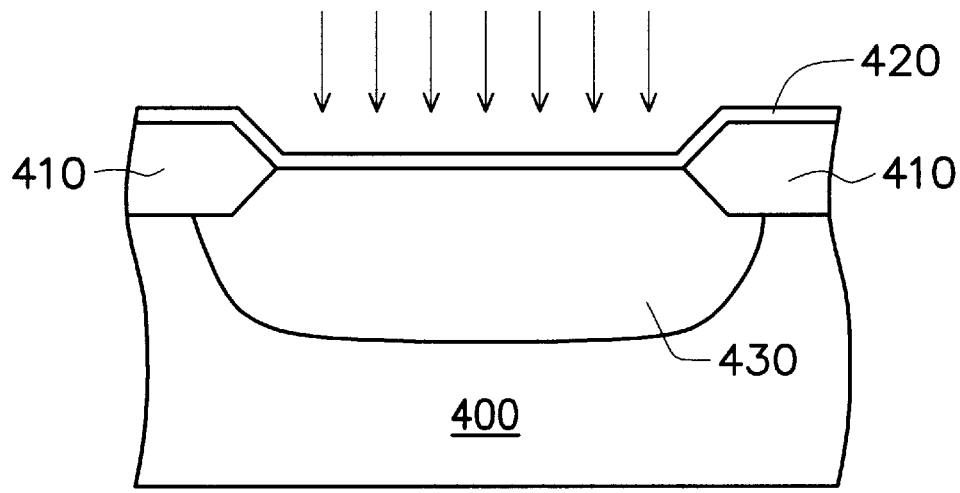

Next, as shown in FIG. 4B, a sacrificial oxide layer 420 is formed over the silicon substrate 400. If the substrate 400 is a P-type, then an ion implantation is carried out to form an N-well 430 in the substrate. On the other hand, if the substrate 400 is an N-type, the above ion implantation step can be omitted. In FIG. 4B, only the case when the silicon substrate 400 is a P-type is shown, hence an N-well 430 is drawn there. The steps involved in the ion implantation operation for forming the N-well 430 include using N-type ions to perform a well implantation, a field implantation and an anti-punchthrough implantation. The well implantation is used for adjusting the latchup immunity of a device. The field implantation is used for maintaining the quality of electrical isolation between a device and its neighbors. The anti-punchthrough implantation is used for adjusting the threshold voltage, leakage current at the turnoff state, and drain current drivability. For example, the well implantation is conducted using phosphorus (P) ions with an implantation dosage level of about $1\times10^{12}\sim 5\times10^{13}$ cm$^{-2}$; the field implantation is conducted using phosphorus (P) ions with an implantation dosage level of about $1\times10^{12}\sim 5\times10^{13}$ cm$^{-2}$; and anti-punchthrough implantation is conducted using heavier ions such as arsenic (As) or antimony (Sb) ions with an implantation dosage level of about $1\times10^{12}\sim 1\times10^{14}$ cm$^{-2}$.

Figure 4C:
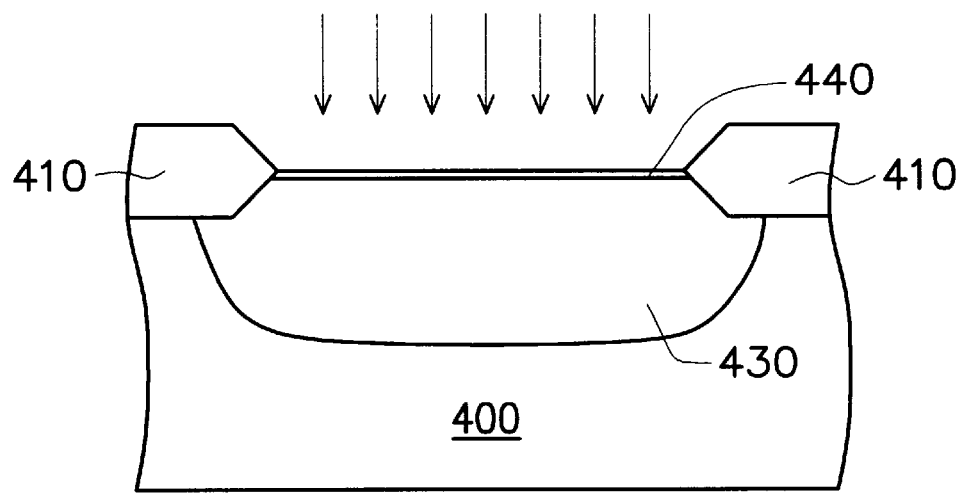

Next, as shown in FIG. 4C, a plasma doping method is used to form a very shallow P-type layer 440 on the substrate 400. Then, the sacrificial oxide layer 420 is removed. Alternatively, the sacrificial oxide layer is removed first, followed by the plasma doping operation to form the very shallow P-type layer 440. In the plasma doping operation, the P-type dopants are implanted into the substrate either through the sacrificial oxide layer 420 (whose thickness must be carefully controlled) or directly into the exposed substrate (if the sacrificial oxide layer 420 is removed to expose the substrate 400 first). For example, boron having a plasma energy level of about 100 eV~1000 eV and a dosage of about $1\times10^{12}\sim 1\times10^{14}$ cm$^{-2}$ can be applied for a sufficient period (for example, 40 seconds) to form a P-type layer having a thickness of about 10 nm to 200 nm. The boron dopants are created by mixing a main gas (for example, gases He, $H_2$) with a diluent gas (for example, 1%–6% of $B_2H_6$).

Figure 4D:
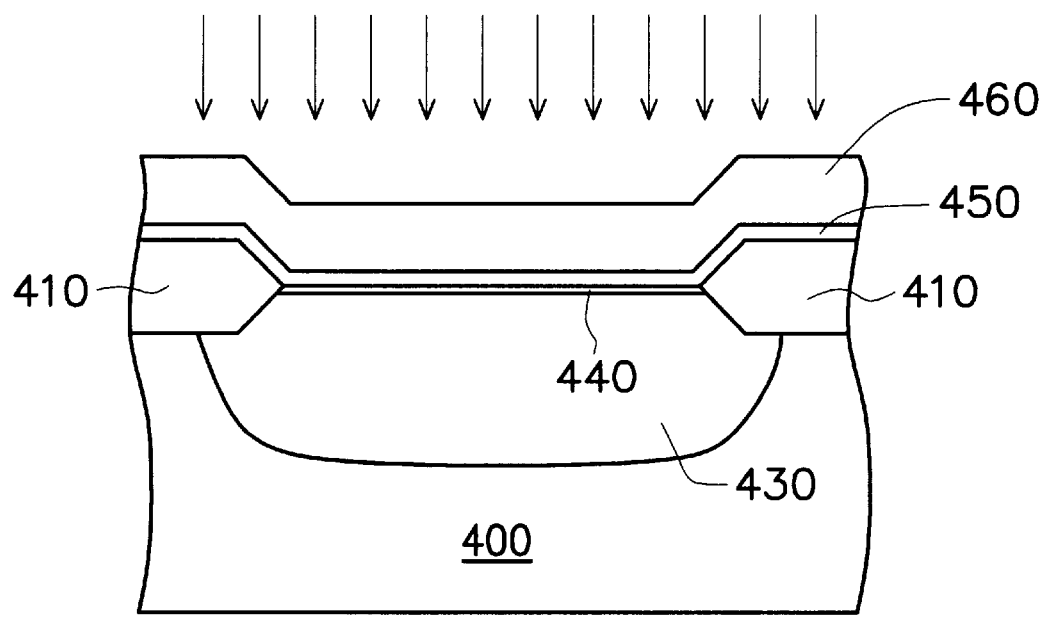

Next, as shown in FIG. 4D, a gate oxide layer 450 and a polysilicon layer 460 are sequentially formed over the substrate 400. Then, N-type dopants are doped into the polysilicon layer 460, for example, using $POCl_3$ as source of dopants in a diffusing operation, or using phosphorus ions as dopants in an ion implantation. Thickness of the gate oxide layer 450 is variable depending upon the function of the device and the reliability limitation of the gate oxide layer. Furthermore, a metal polysilicide layer (not shown in FIG. 4D) can be selectively formed over the surface of the polysilicon layer 460 to lower the resistance of the polysilicon layer 460.

Figure 4E:
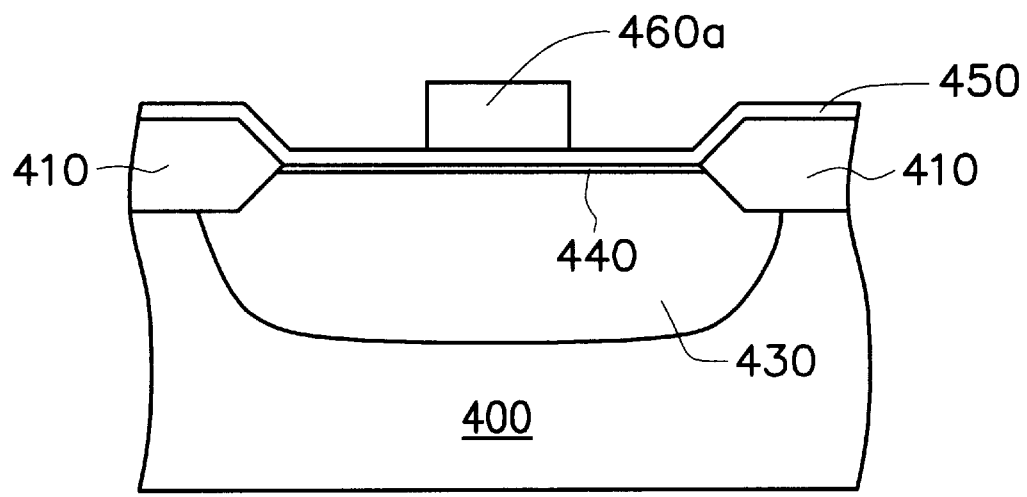

Thereafter, as shown in FIG. 4E, using photolithographic and etching processes, the polysilicon layer 460 is patterned to form a polysilicon gate layer 460a.

Figure 4F:
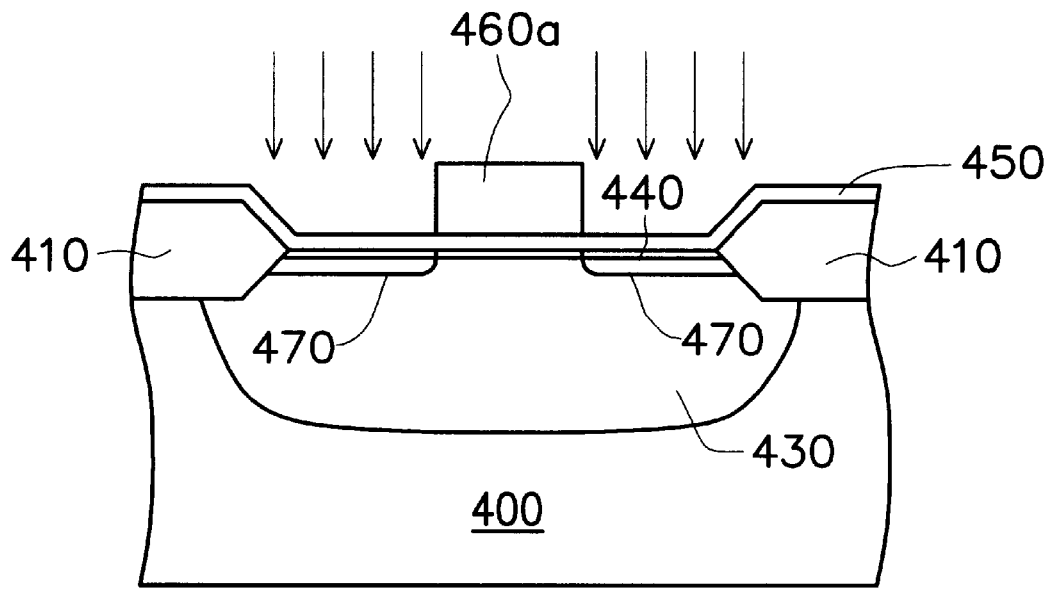

Next, as shown in FIG. 4F, a P-type lightly doped drain (PLDD) implant is performed to establish lightly doped regions 470 in the substrate 400. For example, the lightly doped regions 470 are formed by an implantation using low-energy boron ions or $BF_2$ having a dosage level of about $10^{13}$ cm$^{-2}$ to $10^{14}$ cm$^{-2}$. Moreover, due to short-channel effect, the lightly doped regions 470 preferably should have a shallow junction depth.

Figure 4G:
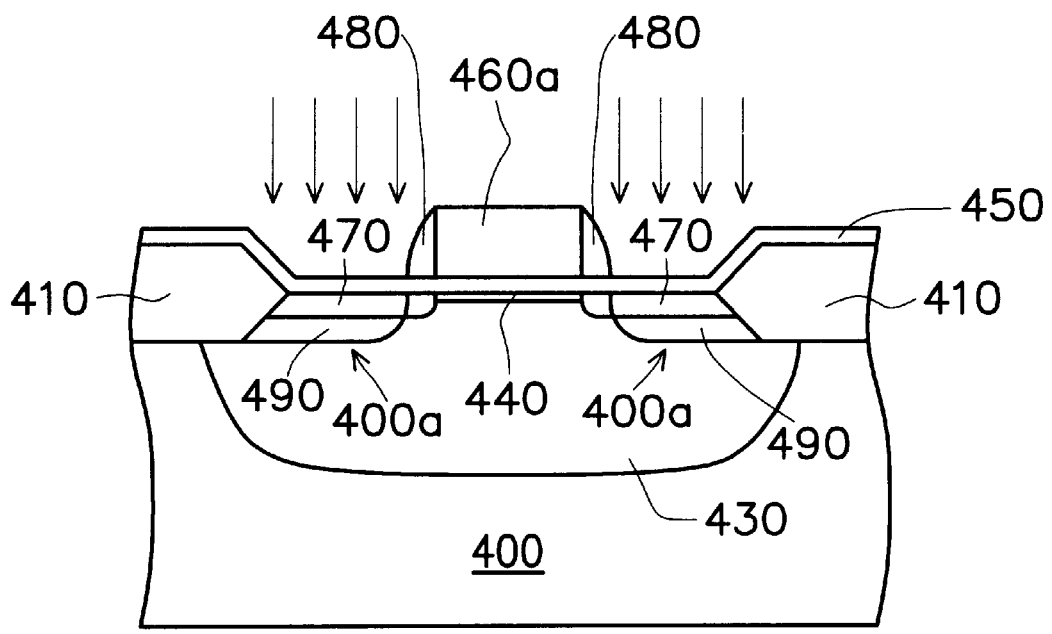

Next, as shown in FIG. 4G, spacers 480 are formed on the sidewalls of the gate polysilicon layer 460a. The spacers 480 can be made from silicon dioxide or silicon nitride and preferably has a width of about 0.05 µm to 2 µm. In the subsequent step, a source/drain implantation is carried out to form heavily doped regions 490 in the substrate 400. For example, the heavily doped regions 490 ire formed by an implantation using low-energy boron ions or $BF_2$ having a dosage level of about $10^5$ cm$^{-2}$. The lightly doped region 470 and the heavily doped region 490 together constitute a source/drain region 400a of the pMOS.

If the PLDD structure is not formed, the aforementioned step as shown in FIG. 4F can be skipped. Furthermore, the steps as shown in FIG. 4G can be amended by forming spacers 480 first, and then a source/drain implantation is performed to establish the source/drain region 400a. In here, the implantation energy for forming the source/drain region is higher than the implantation of source/drain region having a PLDD structure. Alternatively, an annealing process can be added to increase the horizontal doping profile near the source/drain region 400a and to lower source/drain in series resistance.

Figure 4H:
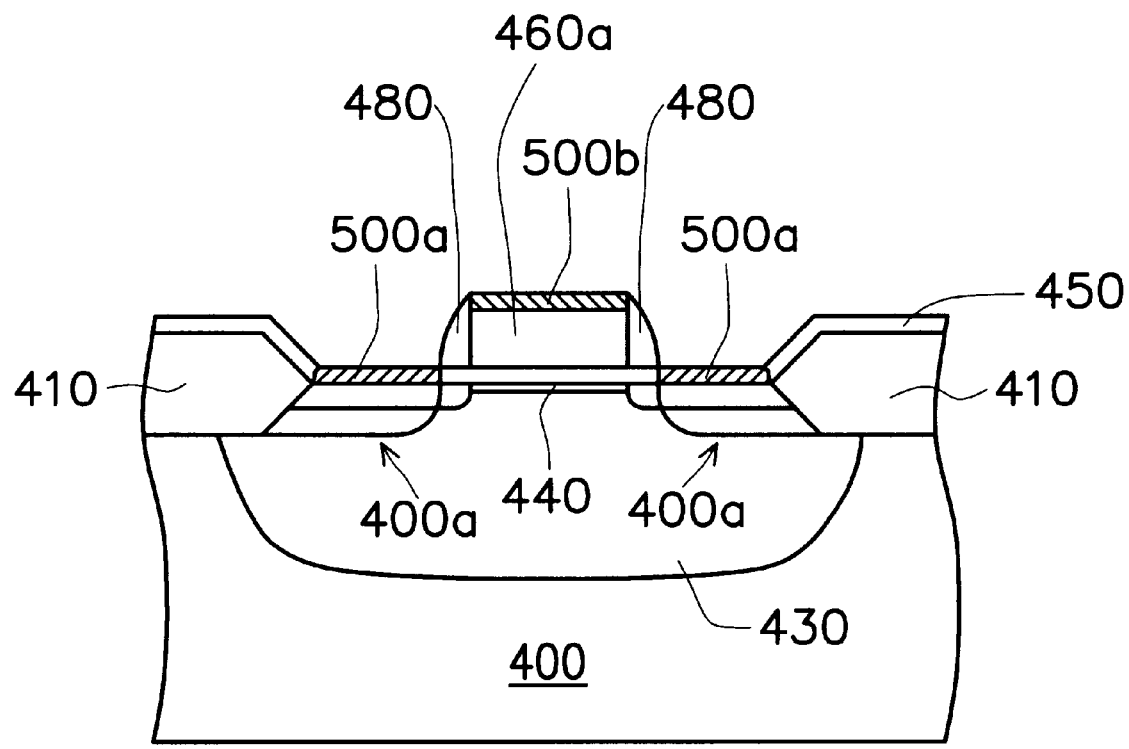

Next, as shown in FIG. 4H, a metal silicide layer 500a is formed over the top surface of the source/drain regions 400a, wherein the metal silicide layer 500a can be a $TiSi_x$ or a $CoSi_x$ layer. In addition, if no metal polysilicide layer is formed over the polysilicon gate layer 460a in a previous step, then a metal polysilicide layer 500b can be formed over the gate polysilicon layer 460a by a self-aligned operation here. However, if a metal polysilicide layer has already formed over the polysilicon gate layer 460a, then only the metal silicide layers 500a will be formed in this step.

From the above description of the preferred embodiment, the P-type layer (junction depth of about 30 nm) formed using boron with energy level of about 100 eV to 1000 eV (for example, 700 eV) in a plasma doping operation is thinner than the P-layer (junction depth of about 40 nm) formed by a low-energy (for example, about 2000 eV) boron implant process. Therefore, the buried-channel pMOSFET device produced by this invention can resist the short-channel effect better than the buried-channel pMOSFET formed by using low-energy boron implant process. Moreover, a plasma doping method allows a few wafers to be placed inside the reaction chamber at the same time, and hence the plasma doping method has a higher throughput than a low-energy boron implant method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a buried-channel pMOSFET device, comprising:

providing an N-type silicon substrate, wherein field oxide layers for defining the active region are already formed on the substrate;

forming a sacrificial oxide layer over the substrate;

forming a very shallow P-type layer over the substrate rising a plasma doping method including applying boron plasma having an energy level of about 100 eV to 1000 eV and a dosage level of about $1\times10^{12}$ to $1\times10^{14}$ cm$^{-2}$ for a sufficient period to form a P-type layer having a thickness of about 10 nm to 200 nm;

removing the sacrificial oxide layer;

forming a gate oxide layer and a polysilicon layer over the substrate, and then doping the polysilicon layer;

patterning the polysilicon layer to form a polysilicon gate layer over the substrate; and forming source/drain regions in the substrate.

2. The method of claim 1, wherein the step of forming the P-type layer includes applying boron plasma for a period of about 20 to 60 seconds.

3. The method of claim 1, wherein the step of forming the P-type layer with boron plasma includes using boron dopants obtained by mixing gaseous helium (He) with 1% to 6% of gaseous $B_2H_6$.

4. The method of claim 1, wherein the step of forming P-type layer with boron plasma includes using boron dopants obtained by mixing gaseous hydrogen ($H_2$) with 1% to 6% of gaseous $B_2H_6$.

5. The method of claim 1, wherein the step of doping the polysilicon layer includes using N-type dopants.

6. The method of claim 1, wherein the step of forming source/drain regions further includes:

forming lightly doped regions in the substrate by performing a P-type lightly doped drain implantation;

forming spacers on the sidewalls of the polysilicon gate layer; and forming heavily doped regions in the substrate by performing a source/drain implantation, wherein the lightly doped region and the heavily doped region together constitute a source/drain region.

7. The method of claim 1, wherein the step of forming source/drain regions further includes:

forming spacers on the sidewalls of the polysilicon gate layer; and forming heavily doped regions in the substrate by performing a source/drain implantation, wherein the lightly doped region and the heavily doped region together constitute a source/drain region.

8. The method of claim 7, wherein the step of forming, the source/drain regions further includes annealing to increase the horizontal profile of source/drain regions for lowering the source/drain in series resistance.

9. The method of claim 1, wherein after the step of forming the gate oxide layer and the polysilicon layer but before the patterning of the polysilicon layer, forming a metal polysilicide layer over the upper surface of the polysilicon layer.

10. The method of claim 9, wherein the step of forming the metal polysilicide layer over the upper surface of the polysilicon layer further includes forming a metal silicide layer over the source/drain regions.

11. The method of claim 1, wherein after the step of forming the source/drain regions, forming a metal silicide layer over the source/drain regions and forming a metal polysilicide layer over the upper surface of the polysilicon gate layer.

12. The method of claim 1, wherein the step of providing the first type silicon substrate includes providing a P-type silicon substrate, and that after the step of forming the sacrificial oxide layer but before the plasma doping operation further includes implanting ions to form an N-well.

13. The method of claim 12, wherein the step of implanting ions to form the N-well further includes using N-type ions to carry out a well implantation, a field implantation and an anti-punchthrough implantation.

14. A method for manufacturing a buried-channel pMOSFET device, comprising:

providing a P-type silicon substrate, and wherein field oxide layers for defining the active region are already formed on the substrate;

forming a sacrificial oxide layer over the substrate;

implanting ions to form an N-well;

forming a very shallow P-type layer over the substrate using a plasma doping method;

removing the sacrificial oxide layer;

forming a gate oxide layer and a polysilicon layer over the substrate, and then doping the polysilicon layer;

patterning the polysilicon layer to form a polysilicon gate layer over the substrate; and forming source/drain regions in the substrate; and wherein the step of forming the P-type layer by a plasma doping method includes applying boron plasma having energy level of about 100 eV to 1000 eV and a dosage level of about $1 \times 10^{12}$ to $1 \times 10^{14}$ cm$^{-2}$ for a sufficient period to form a P-type layer having a thickness of about 10 nm to 200 nm.

15. The method of claim 14, wherein the step of forming the P-type layer includes applying boron plasma for a period of about 20 to 60 seconds.

16. The method of claim 14, wherein the step of forming the P-type layer with boron plasma includes using boron dopants obtained by mixing gaseous helium (He) with 1% to 6% of gaseous $B_2H_6$.

17. The method of claim 14, wherein the step of forming the P-type layer with boron plasma includes using boron dopants obtained by mixing gaseous hydrogen (H$_2$) with 1% to 6% of gaseous $B_2H_6$.

18. The method of claim 12, wherein the step of doping the polysilicon layer includes using N-type dopants.

19. The method of claim 12, wherein the step of forming source/drain regions further includes:

forming lightly doped regions in the substrate by performing a P-type lightly doped drain implantation;

forming spacers on the sidewalls of the polysilicon gate layer; and forming heavily doped regions in the substrate by performing a source/drain implantation, wherein the lightly doped region and the heavily doped region together constitute a source/drain region.

20. The method of claim 12, wherein the step of forming source/drain regions further includes:

forming spacers on the sidewalls of the polysilicon gate layer; and forming heavily doped regions in the substrate by performing a source/drain implantation, wherein the lightly doped region and the heavily doped region together constitute a source/drain region.

21. The method of claim 20, wherein the step of forming the source/drain regions further includes annealing to increase the horizontal profile of source/drain regions for lowering the source/drain in series resistance.

22. The method of claim 12, wherein after the step of forming the gate oxide layer and the polysilicon layer but before the patterning of the polysilicon layer, further includes forming a metal polysilicide layer over the upper surface of the polysilicon layer.

23. The method of claim 22, wherein the step of forming the metal polysilicide layer over the upper surface of the polysilicon layer further includes forming a metal silicide layer over the source/drain regions.

24. The method of claim 12, wherein after the step of forming the source/drain regions further include forming a metal silicide layer over the source/drain regions and forming a metal polysilicide layer over the upper surface of the polysilicon gate layer.

25. A method for manufacturing a buried channel pMOSFET device, comprising:

providing a first type of silicon substrate, wherein the field oxide layers for defining the active region is already formed on the substrate;

forming a sacrificial oxide layer over the substrate;

forming a very shallow P-type layer on the substrate using a plasma doping method including applying boron plasma having energy level of about 100 eV to 1000 eV and a dosage level of about $1 \times 10^{12}$ to $1 \times 10^{14}$ cm$^{-2}$ for a sufficient period to form a P-type layer having a thickness of about 10 nm to 200 nm;

removing the sacrificial oxide layer;

forming a gate oxide layer and a polysilicon layer over the substrate, and then doping the polysilicon layer;

patterning the polysilicon layer using photolithographic and etching processes to form a polysilicon gate layer over the substrate; and forming source/drain regions in the substrate.

26. The method of claim 25, wherein the step of providing the first type silicon substrate includes providing an N-type silicon substrate.

27. The method of claim 25, wherein the step of forming the P-type layer includes applying boron plasma for a period of about 20 to 60 seconds.

28. The method of claim 25, wherein the step of forming the P-type layer with boron plasma includes using boron dopants obtained by mixing gaseous helium (He) with 1% to 6% of gaseous $B_2H_6$.

29. The method of claim 25, wherein the step of forming the P-type layer with boron plasma includes using boron dopants obtained by mixing gaseous hydrogen (H$_2$) with 1% to 6% of gaseous $B_2H_6$.

30. The method of claim 26, wherein the step of doping the polysilicon layer includes using N-type dopants.

31. The method of claim 26, wherein the step of forming source/drain regions further includes:

forming lightly doped regions in the substrate by performing a P-type lightly doped drain implantation;

forming spacers on the sidewalls of the polysilicon gate layer; and forming heavily doped regions in the substrate by performing a source/drain implantation, wherein the lightly doped region and the heavily doped region together constitute a source/drain region.

32. The method of claim 26, wherein the step of forming source/drain regions further includes:

forming spacers on the sidewalls of the polysilicon gate layer; and forming heavily doped regions in the substrate by performing a source/drain implantation, wherein the lightly doped region and the heavily doped region together constitute a source/drain region.

33. The method of claim 32, wherein the step of forming the source/drain regions further includes annealing to increase the horizontal profile of source/drain regions for lowering the source/drain in series resistance.

34. The method of claim 26, wherein after the step of forming the gate oxide layer and the polysilicon layer but before the patterning of the polysilicon layer, further includes forming a metal polysilicide layer over the upper surface of the polysilicon layer.

35. The method of claim 34, wherein the step of forming the metal polysilicide layer over the upper surface of the polysilicon layer further includes forming a metal silicide layer over the source/drain regions.

36. The method of claim 26, wherein after the step of forming the source/drain regions further include forming a metal silicide layer over the source/drain regions and forming a metal polysilicide layer over the upper surface of the polysilicon gate layer.

37. The method of claim 25, wherein the step of providing the first type silicon substrate includes providing a P-type silicon substrate, and that after the step of providing the first type substrate but before the plasma doping operation further includes:

forming a sacrificial oxide layer over the substrate;

implanting ions into the substrate to form an N-well; arid removing the sacrificial oxide layer.

38. The method of claim 37, wherein the step of implanting ions to form the N-well includes using N-type ions to carry out a well implantation, a field implantation and an-anti-punchthrough implantation.

39. A method for manufacturing a buried channel pMOS-FET device, comprising:

providing a P-type silicon substrate, wherein the field oxide layers for defining the active region is already formed on the substrate;

implanting ions into the substrate to form an N-well;

forming a very shallow P-type layer on the substrate using a plasma doping method;

removing the sacrificial oxide layer;

forming a gate oxide layer and a polysilicon layer over the substrate, and then doping the polysilicon layer;

patterning the polysilicon layer using photolithographic and etching processes to form a polysilicon gate layer over the substrate; and forming source/drain regions in the substrate; and wherein the step of forming the P-type layer by a plasma doping method includes applying boron plasma having energy level of about 100 eV to 1000 eV and a dosage level of about $1\times10^{12}$ to $1\times10^{14}$ cm$^{-2}$ for a sufficient period to form a P-type layer having a thickness of about 10 nm to 200 nm.

40. The method of claim 39, wherein the step of forming the P-type layer includes applying boron plasma for a period of about 20 to 60 seconds.

41. The method of claim 39, wherein the step of forming the P-type layer with boron plasma includes using boron dopants obtained by mixing gaseous helium (He) with 1% to 6% of gaseous $B_2H_6$.

42. The method of claim 39, wherein the step of forming the P-type layer with boron plasma includes using boron dopants obtained by mixing gaseous hydrogen ($H_2$) with 1% to 6% of gaseous $B_2H_6$.

43. The method of claim 37, wherein the step of doping the polysilicon layer includes using N-type dopants.

44. The method of claim 37, wherein the step of forming source/drain regions further includes:

forming lightly doped regions in the substrate by performing a P-type lightly doped drain implantation;

forming spacers on the sidewalls of the polysilicon gate layer; and forming heavily doped regions in the substrate by performing a source/drain implantation, wherein the lightly doped region and the heavily doped region together constitute a source/drain region.

45. The method of claim 37, wherein the step of forming source/drain regions further includes:

forming spacers on the sidewalls of the polysilicon gate layer; and forming heavily doped regions in the substrate by performing a source/drain implantation, wherein the lightly doped region and the heavily doped region together constitute a source/drain region.

46. The method of claim 45, wherein the step of forming the source/drain regions further includes annealing to increase the horizontal profile of source/drain regions for lowering the source/drain in series resistance.

47. The method of claim 37, wherein after the step of forming the gate oxide layer and the polysilicon layer but before the patterning of the polysilicon layer, further includes forming a metal polysilicide layer over the upper surface of the polysilicon layer.

48. The method of claim 47, wherein the step of forming the metal polysilicide layer over the upper surface of the polysilicon layer further includes forming a metal silicide layer over the source/drain regions.

49. The method of claim 37, wherein after the step of forming the source/drain regions further include forming a metal silicide layer over the source/drain regions and forming a metal polysilicide layer over the upper surface of the polysilicon gate layer.

* * * * *